(12) United States Patent
Patterson

(10) Patent No.: US 7,768,283 B1
(45) Date of Patent: Aug. 3, 2010

(54) UNIVERSAL SOCKETLESS TEST FIXTURE

(75) Inventor: Joseph Martin Patterson, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 12/535,533

(22) Filed: Aug. 4, 2009

(51) Int. Cl.
*G01R 31/02* (2006.01)
(52) U.S. Cl. ...................... 324/754; 324/761
(58) Field of Classification Search ........ None
See application file for complete search history.

(56) References Cited

U.S. PATENT DOCUMENTS

| | | | |
|---|---|---|---|
| 6,181,145 B1 * | 1/2001 | Tomita et al. | 324/754 |
| 6,246,250 B1 * | 6/2001 | Doherty et al. | 324/765 |
| 7,091,733 B2 * | 8/2006 | Takekoshi et al. | 324/760 |
| 7,554,206 B2 | 6/2009 | Haba et al. | |

* cited by examiner

*Primary Examiner*—Minh N Tang
(74) *Attorney, Agent, or Firm*—Law Office of Gerald Maliszewski; Gerald Maliszewski

(57) ABSTRACT

A universal socketless integrated circuit (IC) electrical test fixture is provided. The test fixture is made up of a probing platform to accept and heatsink an IC. The IC has electrical contacts formed on a bottom surface in an array of m rows, where each row includes n, or less contacts. A probe arm includes p probe pins, where p is greater than, or equal to n. A clamping mechanism mechanically interfaces the probe arm probe pins to a row of IC contacts under test. An electrical measurement device has a first interface connected to the p probe pins of the probe arm to measure electrical characteristics associated with the IC contacts under test. The probe arm, clamping mechanism, and probe platform work in cooperation to electrically interface any row of the IC contacts with the electrical measurement device.

8 Claims, 5 Drawing Sheets

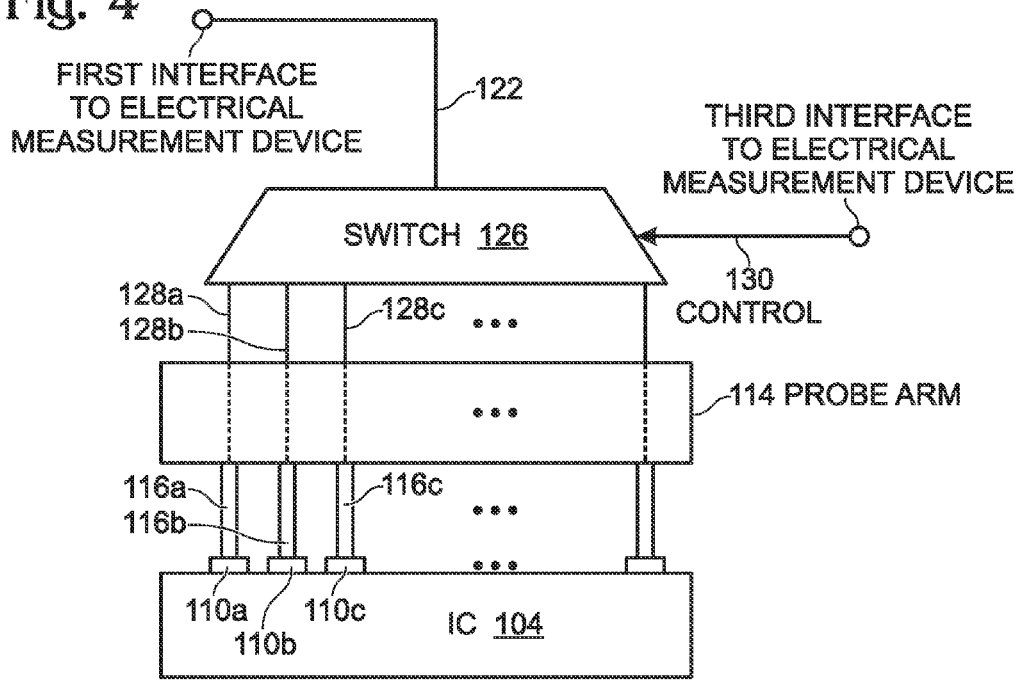
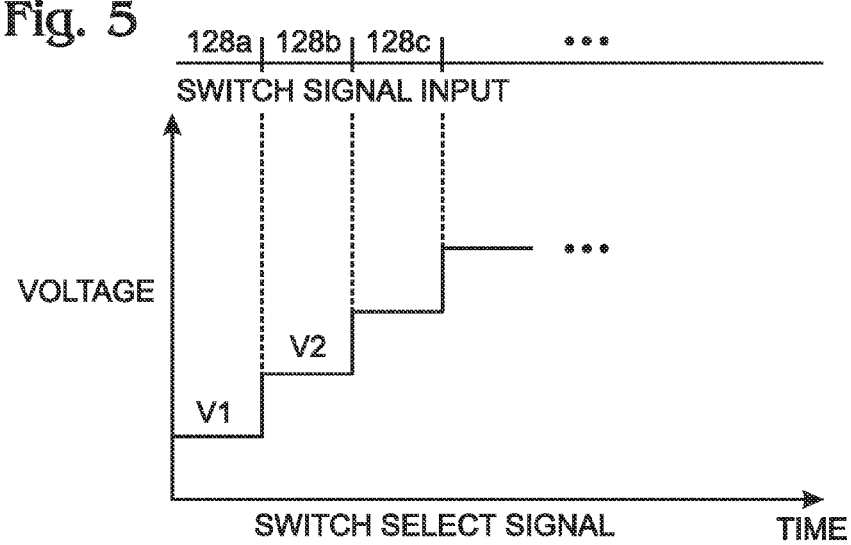

UNIVERSAL SOCKETLESS TEST FIXTURE

BACKGROUND OF THE INVENTION

1. Field of the Invention

This invention generally relates to integrated circuit (IC) test fixtures and, more particularly, to a universal socketless test fixture.

2. Description of the Related Art

As noted in U.S. Pat. No. 7,554,206, it is valuable to test the electrical connections between the sockets of an IC in order to identify poor connections and defective active circuitry. IC devices have evolved from through-board pins to the surface mounting of a device to a socket and PCB. The input and output contacts of an IC chip are generally disposed in grid-like patterns that substantially cover a surface of the device or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

For example, surface mounting packages commonly include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Semiconductor chips are commonly provided in packages that facilitate handling of the chip during manufacture and during mounting of the chip on an external substrate such as a circuit board or other circuit panel. An IC that is designed to be surface mounted has pads, or flat conductive discs, on its packaging. Many packages include solder masses in the form of solder balls, typically about 1.0 mm and about 0.8 mm (40 mils and 30 mils) in pitch, and 0.4 to 0.5 mm in diameter, attached to the terminals of the package. A package having an array of solder balls projecting from its bottom surface is commonly referred to as a ball grid array or "BOA" package. For a BGA device there are solder bumps on the pads for connection with a BGA socket. The solder bumps typically fit into grips on a BGA socket for connection to a PCB. Other packages, referred to as land grid array or "LGA" packages are secured to the substrate by thin layers or lands (pads) formed from solder. The pads of an LGA require a socket containing springs or some other type of conductive trace to connect the device to the PCB.

In testing packaged devices, it is necessary to make temporary connections between the terminals of the packaged device and a test fixture, and operate the device through these connections to assure that the device is fully functional. Ordinarily, these temporary connections must be made without bonding the terminals of the package to the test fixture. It is important to assure that all of the terminals are reliably connected to the conductive elements of the test fixture.

A socket is typically used to interface IC contacts to a test fixture. A socket may have a plastic body, metal contacts, and a metal lever or latch to temporary secure the IC to the socket—physically securing the IC under test, as well as causing an electrical connection between all the IC pins and the socket.

A test fixture may consist of an array of switch pairs, where one switch connects a single signal trace to a single power trace and the other switch connects the signal trace to a single ground trace. Multiple switch pairs are used to connect all signal traces to independent power and ground traces. Typically, the sockets make electric connections to all the device pins simultaneously. Automation of the process requires a relay/relay driver circuit for each device pin.

Conventionally, the test fixture uses a socket designed for the specific pin count and physical spacing of the package pins. However, these test fixture are often custom made and, therefore, expensive. Further, a test facility may require a multiplicity of sockets and interface boards for a large variety of package types. Finally, because of the cost of socket interfaces, it becomes prohibitively expensive to upgrade the electrical components of the test fixture, to support complicated test algorithms such as curve tracing. Alternately, more complicated testing may be supported through the use of a conventional curve tracer. Without a socket however, hand probing of each pair of device pins is required, which does not lend itself to efficient automated data collection on high pin count packages.

It would be advantageous if a socketless test fixture existed that permitted the testing of any type of IC connector grid array pattern.

It would be advantageous if the socketless test fixture could measure the electrical performance of IC contacts using a curve tracer.

SUMMARY OF THE INVENTION

Disclosed herein is a test fixture that provides a means to make contact to many pins of a packaged IC, without the use of a socket, permitting curve tracer analysis on all pins contacted and real-time interactive curve tracer analysis. The test fixture reduces the need for high pin-count sockets. By simplifying the automated curve tracer analysis process, the real-time examination of the characteristics is enabled. Thus, defects can be observed such as drift, intermittence, and noise, which are unstable and change in a short time frame. This analysis is not available with conventional fully automated curve trace analysis.

Accordingly, a universal socketless integrated circuit (IC) electrical test fixture is provided. The test fixture is made up of a probing platform to accept and heatsink an IC. The IC has electrical contacts formed on a bottom surface in an array of m rows, where each row includes n, or less contacts. A probe arm includes p probe pins, where p is greater than, or equal to n. A clamping mechanism mechanically interfaces the probe arm probe pins to a row of IC contacts under test. An electrical measurement device has a first interface connected to the p probe pins of the probe arm to measure electrical characteristics associated with the n IC contacts under test. The probe arm, clamping mechanism, and probe platform work in cooperation to electrically interface any row of the IC contacts with the electrical measurement device.

In one aspect, the test fixture includes a 1-to-p switch having p signal inputs, where each signal input is connected to a corresponding probe pin in the probe arm. The switch has a control input to accept a select signal for selecting a signal input, and a signal output connected to the electrical measurement device first interface. The electrical test device has a third interface to supply the select signal. In another aspect, the electrical test device is a curve tracer, where the first interface is a port is selected to be either the collector (C) or emitter (E) port. The curve tracer unselected port supplies a reference voltage to one of the IC contacts, and a base port (B) acts as the third interface to supply select signals. The electrical characteristics of the IC contacts under test are measured with respect to the reference voltage, sequentially in response to the select signals.

Additional details of the above-described test fixture and a universal socketless integrated circuit (IC) test method are provided below.

BRIEF DESCRIPTION OF THE DRAWINGS

FIG. 4 is a schematic diagram depicting electrical connections to the switch.

FIG. 5 is a diagram illustrating the relationship between the switch select signal and switch signal input.

DETAILED DESCRIPTION

Figure 1:
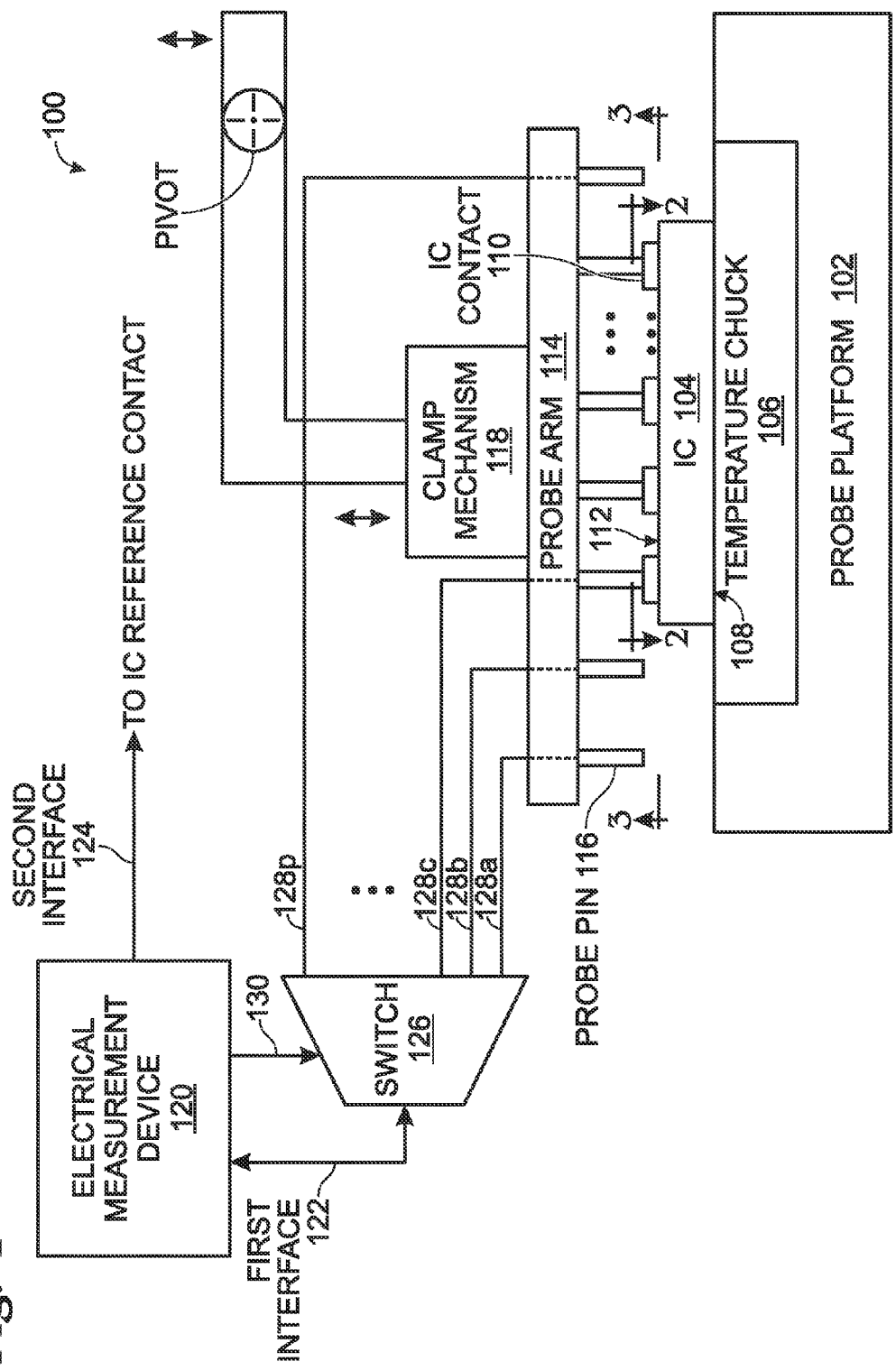
FIG. 1 is a schematic block diagram of a universal socketless integrated circuit (IC) electrical test fixture.

FIG. 1 is a schematic block diagram of a universal socketless integrated circuit (IC) electrical test fixture. The test fixture 100 comprises a probing platform 102 to accept an IC 104. In one aspect, the probe platform 102 is part of a heat sink, or includes a temperature chuck 106 to accept a top surface 108 of the IC 104. The temperature of the chuck 106 can be controlled to support environmental temperature testing of the IC 104. The IC 104 has electrical contacts 110 formed on a bottom surface 112 in an array of m rows, where each row includes n, or less contacts. A probe arm 114 includes p probe pins 116, where p is typically greater than, or equal to n. A spring-loaded pogo pins is one example of a probe pin. Note: n, m, and p are variables not limited to any particular value. When p is less than n, the probe arm position must be changed more often, if IC contact is to be tested.

Figure 2:
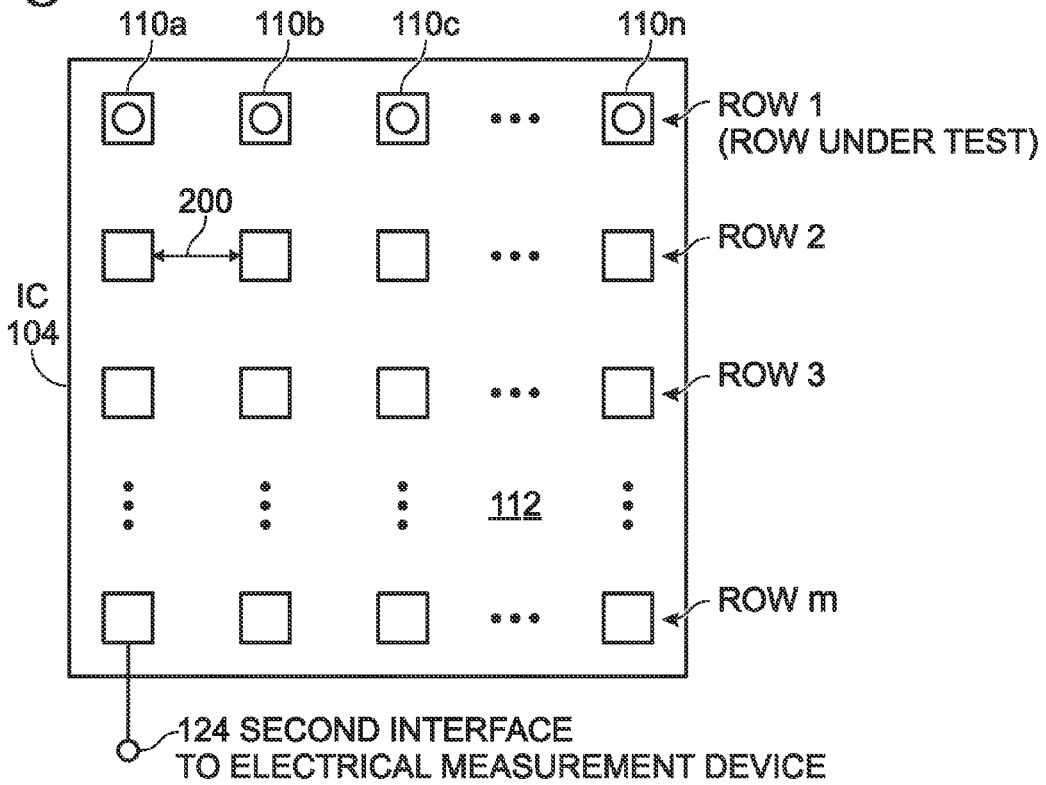
FIG. 2 is a plan view of the IC bottom surface showing m rows of IC contacts.

FIG. 2 is a plan view of the IC bottom surface showing m rows of IC contacts. In row 1, contacts 110a through 110n are shown, with a spacing 200 between contacts.

Figure 3:
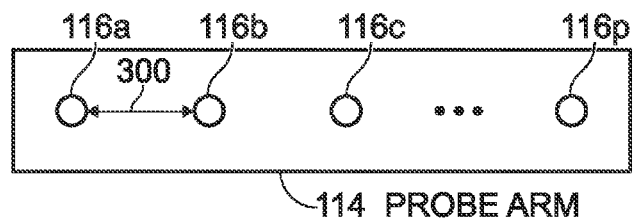
FIG. 3 is a plan view showing a row of probe pins mounted on the probe arm.

FIG. 3 is a plan view showing a row of probe pins 116 mounted on the probe arm 114. The spacing 300 between the probe pins 116 about matches the spacing between IC contacts (see FIG. 2). As shown, the p probe pins are mounted in the probe arm in a straight row. However, other probe pin mounting arrangements would be possible.

Returning to FIG. 1, a clamping mechanism 118 is used to mechanically interface the probe arm probe pins 116 to a row of n IC contacts 110 under test. A number of suitable mechanisms can be adapted for this purpose, and the test fixture is not limited to any particular one. An electrical measurement device 120 has a first interface on line 122 that is connected to the p probe pins 116 of the probe arm to measure electrical characteristics associated with the IC contacts 110 under test. Some examples of electrical characteristics include current, voltage, real and imaginary impedances, and delay.

The probe arm 114, clamping mechanism 118, and probe platform 102 work in cooperation to electrically interface any row of the IC contacts with the electrical measurement device. That is, the clamping mechanism can be engaged and disengaged to so that each row of IC contacts can be tested in sequence. The test fixture is not limited to testing an IC with any particular array pattern. The only limitation is that the spacing between the IC contacts approximately match the spacing between probe pins. In one aspect, the probe arm 114, clamping mechanism 118, and probe platform 102 work in cooperation to automatically electrically interface every row of the IC contacts with the electrical measurement device, in succession. For example, the test fixture initially connects the probe arm to row 1 of IC contacts, and after completing testing, releases. After moving the probe arm or probe platform, the probe is applied to row 2 of the IC contacts. In that manner, the rows of IC contacts are tested in succession.

In one aspect as shown, the electrical measurement device 120 has a second interface on line 124 to supply a reference voltage to an IC reference contact 110, and the electrical characteristics of the IC contacts under test are measured with respect to the reference voltage. For example, the reference IC contact may be a power supply pin or ground. Alternately but not shown, the electrical measurement device 120 supplies a reference voltage, via the first interface on line 122, to one of the IC contacts under test, so that the electrical characteristics of the IC contacts under test are measured with respect to the reference voltage. In some aspects the second interface supplies both a ground and a power supply voltage, or a plurality of power supply voltages.

In one aspect, a second probe arm (not shown) may be used as the second interface to supply the reference voltage. The second probe may have p probe pins. The movement of the second probe may be independent of the first probe arm. That is, the second probe arm may be connected to any row of IC contacts, independent of row connected to the first probe arm. As explained below in the context of the first probe arm 114, a second probe arm may be associated with a switching mechanism, so that a variety of different reference voltages may be switched to a particular IC contact (probe pin), or so that a reference voltage may be selectively supplied to different IC contacts (probe pins) interfaced to the second probe arm.

In another aspect, the test fixture 100 further comprises a 1-to-p switch or multiplexer 126 having p signal inputs 128.

FIG. 4 is a schematic diagram depicting electrical connections to the switch 126. Each signal input 128 is connected to a corresponding probe pin 116 in the probe arm. For example, signal input 128a is connected to probe pin 116a, signal input 128b to probe pin 116b, etc. The switch 126 has a control input on line 130 to accept a select signal for selecting a signal input. A signal output is connected to the electrical measurement device first interface on line 122. The electrical test device has a third interface on line 130 to supply the select signal.

FIG. 5 is a diagram illustrating the relationship between the switch select signal and switch signal input. In one aspect, the switch control input on line accepts a select signal with at least n possible voltage levels. The switch selects a signal input in response to the select signal voltage level. Other switch control mechanisms are known that could be used to enable the test fixture. For example, digital selection mechanisms are known. Advantageously as explained below, the stepped voltage selection mechanism permits the use of a curve tracer as a switch controller.

Figure 6:
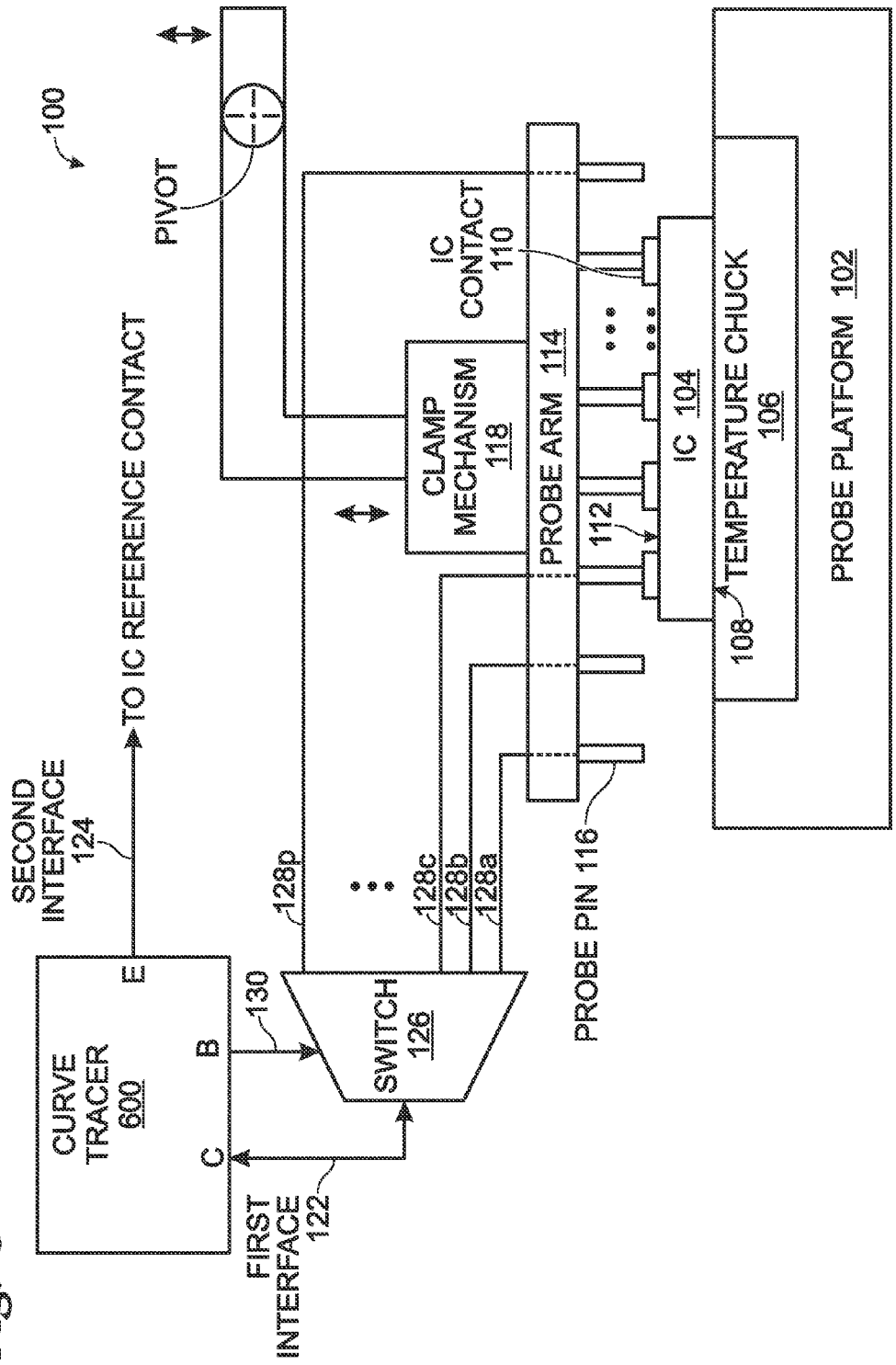
FIG. 6 is a schematic block diagram depicting the test fixture of FIG. 1, where the electrical test device is a curve tracer.

FIG. 6 is a schematic block diagram depicting the test fixture of FIG. 1, where the electrical test device is a curve tracer. In this aspect, the curve tracer 600 has a first interface on line 122 that is selected to be either the collector port (C) or the emitter (E) port. Typically, the collector port is used. Then, the unselected port (e.g., the emitter port) is used as the second interface on line 124, which supplies the reference voltage to one of the IC contacts. The base port (B) is the third interface on line 130, which supplies the select signal. In this manner, the electrical characteristics of the IC contacts under test are measured with respect to the reference voltage, sequentially in response to the select signals.

It should be understood that a curve tracer, as conventionally used in the step generator mode, can measure transistor collector electrical characteristics at a number of different base currents (voltages). Typically, the base current (voltage) is stepped, and the collector current (voltage) is measured at each step. As adapted for use with the test fixture of FIG. 6, each time the curve tracer "steps" to a new base current (voltage), a different signal input 128 on the switch is selected. Thus, for each base step, the curve tracer collector port measures electrical characteristics associated with a unique IC contact. For example, (see FIG. 5) in response to a base voltage v1, switch input 128a is enabled and the collector port of the curve tracer is able to measure the electrical characteristics associated with IC contact 110a via probe pin 116a (see FIG. 4). When the base voltage steps to v2, switch input 128b is enabled and the collector port of the curve tracer is able to measure the electrical characteristics associated with IC contact 110b via probe pin 116b.

A further advantage to using the curve tracer base port to control the external switching is the simultaneous storage of the measurement in the curve tracer memory. Most digital curve tracers have internal memory storage capability. The memory storage is synchronized with the step waveform on the base port. Thus, the external measurement on the collector or emitter port is synchronized with the base port signal, and kept is kept in a curve tracer internal memory. The external measurement can be recalled in response to referencing the base port voltage (switch control signal), which in turn, can be referenced to a particular IC contact.

Figure 7:
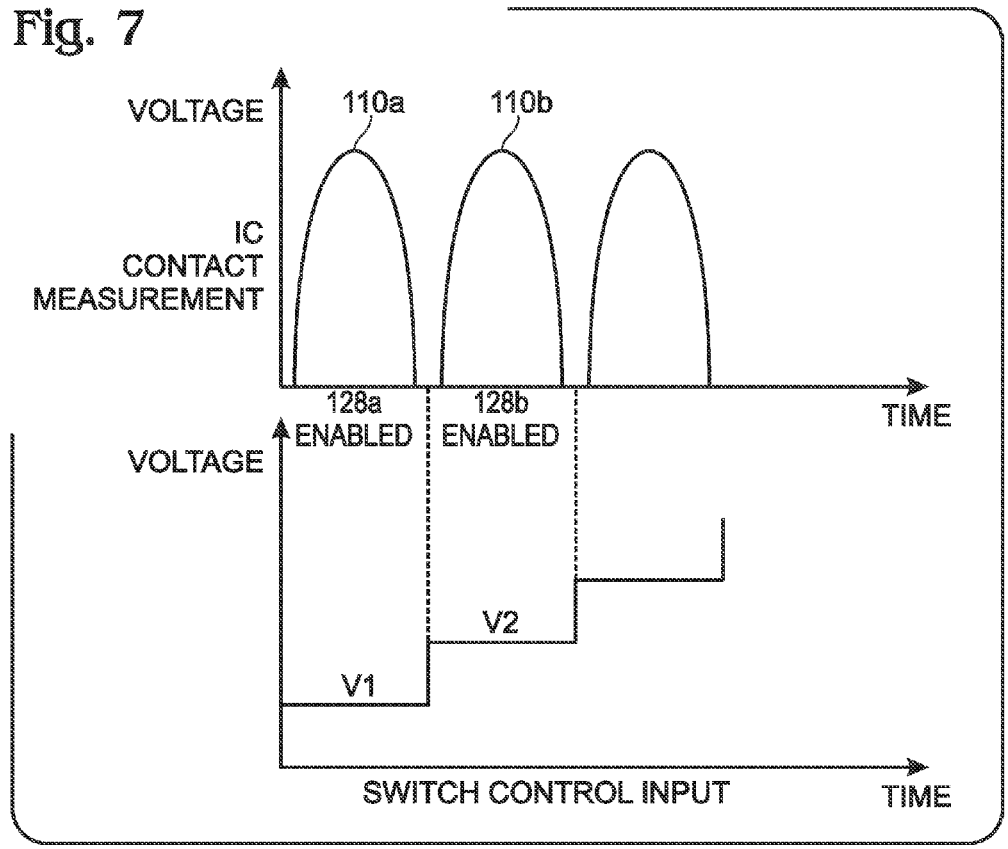
FIG. 7 is a diagram illustrating a variation in the relationship between the switch select signal and switch signal input.

FIG. 7 is a diagram illustrating a variation in the relationship between the switch select signal and switch signal input. In one aspect, the curve tracer selected port (e.g., collector port) supplies a plurality of electrical stimuli to each selected IC contact and measures a corresponding plurality of electrical characteristics for each IC contact under test. As shown for example, during the period associated with v1, switch input 128a is enabled and the collector port of the curve tracer is able to supply a sinusoidal waveform and measure the resulting waveform of electrical characteristics associated with IC contact 110a.

Functional Description

The above-described test fixture makes electrical connections directly to the pins of a package device, using one row of probe pins attached to a probing arm. The probe arm is assembled with the probe pins spacing being the same as that of the package pin pitch. Each row of device pins (contacts) is measured by sequentially stepping the row of probe pins across consecutive rows of package pins. Parametric measurements such as curve tracer analysis may be conducted on each probed pin. The test fixture eliminates the need for sockets and interface boards and permits real-time viewing of the device curves. Further, since the device under test is upside-down (pins up), the probe platform may be a temperature controlled chuck, which permits measurements to be made over temperature.

Figure 8:
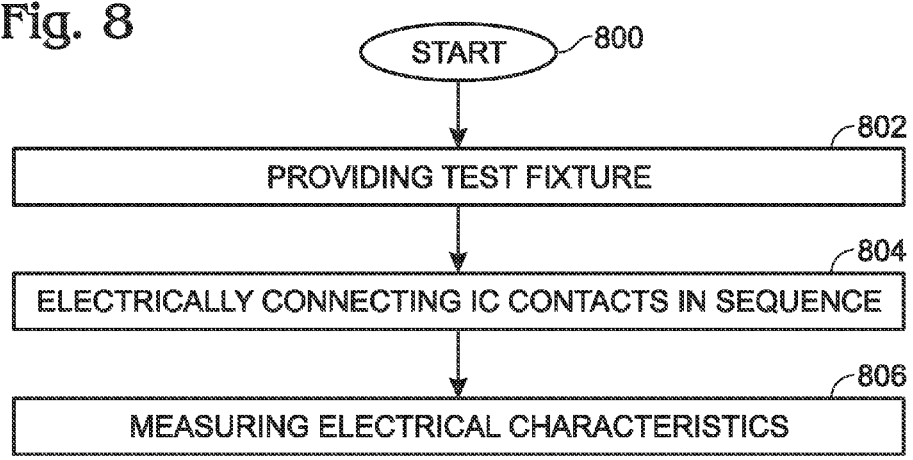
FIG. 8 is a flowchart illustrating a universal socketless IC test method.

FIG. 8 is a flowchart illustrating a universal socketless IC test method. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 800.

Step 802 provides a test fixture including a probing platform to accept an IC with electrical contacts formed in an array of m rows, where each row includes n, or less contacts. The test fixture also comprises a probe arm including p probe pins, where p is greater than or equal to n, and a clamping mechanism to mechanically interface the probe arm probe pins to a row of n IC contacts under test (see FIG. 1). Step 803 mechanically connects the probe arm probe pins to a selected row of IC contacts under test. Step 804 electrically connects each IC contact under test to an electrical measurement device, in sequence, via the probe pins. Step 806 measures electrical characteristics associated with the IC contacts under test.

In one aspect, sequentially connecting each of the IC contacts to the electrical measurement device in Step 804 includes sequentially connecting each of the IC contacts under test to an electrical measurement device with a single measurement port or input channel. In another aspect, Step 804 uses a switch with p signal inputs to sequentially connect each of the IC contacts to the electrical measurement device via a switch output.

In one aspect, measuring electrical characteristics associated with the IC contacts in Step 806 may include measuring electrical characteristics with a curve tracer. Providing the test fixture in Step 802 includes providing a reference voltage to one of the IC contacts. Sequentially connecting each of the IC contacts in Step 804 includes using a base (B) port of the curve tracer to supply a switch control signal, and measuring electrical characteristics in Step 806 includes connecting the switch output to a selected port that is either the collector or emitter port. Then, the curve tracer unselected port can supply the reference voltage.

A universal socketless test fixture and associated test method have been provided. Examples of waveforms and hardware implementations have been given to illustrate the invention. However the invention is not limited to merely these examples. Other variations and embodiments of the invention will occur to those skilled in the art.

I claim:

1. A universal socketless integrated circuit (IC) electrical test fixture, the test fixture comprising:

a probing platform to accept an IC, the IC having electrical contacts formed on a bottom surface in an array of m rows, where each row includes n contacts, where m is a variable greater than, or equal to 1, and n is a variable greater than, or equal to 1;

a probe arm including p probe pins, where p is variable greater than, or equal to n;

a clamping mechanism to mechanically interface the p probe pins to a row of n IC contacts under test;

an electrical measurement device having a first interface connected to the p probe pins of the probe arm to measure electrical characteristics associated with the IC contacts under test, a second interface to supply a reference voltage, and a third interface to supply a select signal;

a 1-to-p switch having p signal inputs, where each signal input is connected to a corresponding probe pin in the probe arm, the switch having a control input to accept a select signal with at least n possible voltage levels for selecting a signal input in response to the select signal voltage level, and a signal output connected to the electrical measurement device first interface;

wherein the probe arm, the clamping mechanism, and the probe platform work in cooperation to electrically interface any row of the IC contacts with the electrical measurement device; and, wherein the electrical measurement device is a curve tracer, where the first interface is a port selected from a group consisting of a collector port (C) and an emitter (E) port, the curve tracer including an unselected port as a second interface supplying the reference voltage to one of the IC contacts, and a base port (B) as the third interface, and where the electrical characteristics of the IC contacts under test are measured with respect to the reference voltage, sequentially in response to the select signals.

2. The test fixture of claim 1 wherein the electrical characteristics of the IC contacts under test are measured with respect to the reference voltage.

3. The test fixture of claim 1 wherein the curve tracer selected port supplies a plurality of electrical stimuli to each selected IC contact and measures a corresponding plurality of electrical characteristics for each IC contact under test.

4. The test fixture of claim 1 wherein the probe arm, the clamping mechanism, and the probe platform work in cooperation to automatically electrically interface every row of the IC contacts with the electrical measurement device, in succession.

5. The test fixture of claim 1 wherein the p probe pins are mounted in the probe arm in a straight row.

6. The test fixture of claim 1 wherein the probe platform includes a temperature chuck to accept a top surface of the IC.

7. A universal socketless integrated circuit (IC) test method, the method comprising:

providing a test fixture including a probing platform to accept an IC with electrical contacts formed in an array of m rows, where each row includes n contacts, where m is a variable greater than or equal to 1, where n is a variable greater than, or equal to 1, a probe arm including p probe pins, where p is a variable greater than or equal to n, and a clamping mechanism to mechanically interface the probe arm probe pins to a row of n IC contacts under test;

mechanically connecting the probe arm probe pins to a selected row of IC contacts under test;

using a switch with p signal inputs to electrically connect each of the IC contacts under test, via the probe pins, to a curve tracer electrical measurement device through a switch output, by using a base (B) port of the curve tracer to supply a switch control signal; and, measuring electrical characteristics associated with the IC contacts under test by connecting the switch output to a curve tracer port selected from a group consisting of a collector (C) port and an emitter (E) port.

8. The method of claim 7 wherein the curve tracer unselected port supplies a reference voltage to an IC reference contact.

* * * * *